(12) United States Patent
Furuta et al.

(10) Patent No.: US 7,884,749 B2
(45) Date of Patent: Feb. 8, 2011

(54) A/D CONVERTING APPARATUS (75) Inventors: Masanori Furuta, Mishima (JP);
Tomohiko Ito, Yokohama (JP);
Takafumi Yamaji, Yokohama (JP);
Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/349,180

(22) Filed: Jan. 6, 2009

(65) Prior Publication Data
US 2009/0184857 A1 Jul. 23, 2009

(30) Foreign Application Priority Data

Jan. 7, 2008 (JP) .............................. P2008-000827

(51) Int. Cl.
*H03M 1/38* (2006.01)
(52) U.S. Cl. ..................... 341/161; 341/156; 341/162; 341/163; 341/172
(58) Field of Classification Search ................ 341/156, 341/161–163, 172
See application file for complete search history.

(56) References Cited

U.S. PATENT DOCUMENTS

| 6,124,818 | A | 9/2000 | Thomas et al. |
| 6,879,277 | B1 * | 4/2005 | Cai ............................ 341/155 |
| 6,914,550 | B2 * | 7/2005 | Cai ............................ 341/155 |

OTHER PUBLICATIONS

Louwsma et al, A 1.35 GS/s, 10b, 175mW Time-Interleaved AD Converter in 0.13 um CMOS, 2007 Symposium on VLSI Circuits Digest of Technical Papers, pp. 62-63.

* cited by examiner

*Primary Examiner*—Khai M Nguyen
(74) *Attorney, Agent, or Firm*—Turocy & Watson, LLP (57) ABSTRACT

An A/D converting apparatus includes a first A/D converter to sample an analog input signal having a D/A converter to generate a comparative signal for successive comparison with the analog input signal, a signal generator generate a differential signal between the analog input signal and the comparative signal, and a comparator to compare the comparative signal with a standard value to generate a first digital signal exhibiting high-order bit; an amplifier to amplify the differential signal to generate a residue signal; and a second A/D converter to sample the residue signal to generate a second digital signal exhibiting low-order bit.

7 Claims, 11 Drawing Sheets

Sample Phase

FIG. 4B

Holding phase

FIG. 4C

Comparing phase

S2 -> GND
S3 -> OFF
S4 -> ON
S5 -> OFF
S6abd -> OFF
S6c -> ON
S7 -> OFF

Analog input signal sampling phase

FIG. 6B

S2 -> GND
S3 -> OFF
S4 -> OFF
S5 -> ON
S6abd -> OFF
S6c -> ON
S7 -> OFF

S2a -> Vref
S2bcde -> GND
S3 -> OFF
S4 -> OFF
S5 -> ON
S6abd -> OFF
S6c -> ON
S7 -> OFF Analog-to-digital converting phase

FIG. 6C

S2ab -> Vref
S2cd -> GND
S2e -> OFF
S3 -> OFF
S4 -> OFF
S5 -> ON
S6cd -> ON
S6ab -> OFF
S7 -> OFF Residue signal amplifying phase

($a_2$): Ain sampling
  S4 -> ON
  S6 -> 52

($b_2$): High-order bit A/D conversion
  S4 -> OFF
  S5 -> ON
  S6 -> 52

($c_2$): Residue signal amplification
  S4 -> OFF
  S5 -> ON
  S6 -> 50

($d_2$): Residue sampling
  S4 -> OFF
  S5 -> OFF
  S6 -> 50

($e_2$): Low-order bit A/D conversion
  S4 -> OFF
  S5 -> ON
  S6 -> 52

FIG. 9A

S2 -> GND
S3 -> OFF
S4 -> ON
S5 -> OFF
S6abd -> OFF
S6c -> ON
S7 -> OFF (1) Analog input signal sampling phase

FIG. 9B

S2 -> GND
S3 -> OFF
S4 -> OFF
S5 -> ON
S6abd -> OFF
S6c -> ON
S7 -> OFF

S2a -> Vref
S2bcde -> GND
S3 -> OFF
S4 -> OFF
S5 -> ON
S6abd -> OFF
S6c -> ON
S7 -> OFF (2) High-order bit analog-to-digital converting phase
(5) Low-order bit analog-to-digital converting phase

FIG. 9C

S2ab -> Vref
S2cd -> GND
S2e -> OFF
S3 -> OFF
S4 -> OFF
S5 -> ON
S6cd -> ON
S6ab -> OFF
S7 -> OFF (3) Residue signal amplifying phase

FIG. 9D

S2 -> OFF
S3 -> ON
S4 -> OFF
S5 -> OFF
S6ac -> OFF
S6bd -> ON
S7 -> ON (4) Residue signal sampling phase

FIG. 10

A/D CONVERTING APPARATUS

CROSS-REFERENCE TO RELATED APPLICATIONS

This application is based upon and claims the benefit of priority from the prior Japanese Patent Application No. 2008-000827, filed on Jan. 7, 2008; the entire contents of which are incorporated herein by reference.

BACKGROUND OF THE INVENTION

1. Field of the Invention

The present invention relates to an analog-to-digital converter (ADC) for converting an analog signal into a digital signal.

2. Description of the Related Art

As an ADC with low power consumption, a successive comparative ADC with a capacitive D/A converter (capacitive DAC) is known. The successive comparative ADC includes a plurality of capacitors which are binarily weighted in capacitance and connected in parallel to one another, a plurality of switching elements for controlling the interconnections of the capacitors, a comparator comprised of an amplifier and a latch circuit and a logic circuit for generating a switching control signal. It takes long period of time for the successive comparative ADC to realize high resolution. In order to constitute the successive comparative ADC as a high resolution ADC, it is also required for the successive comparative ADC to have a large area corresponding to the number of capacitor.

On the other hand, a pipelined successive comparative ADC is proposed where the conversion period of time of the successive comparative ADC can be shortened and the area corresponding to the number of capacitor can be reduced even though the successive comparative ADC is constituted as a high resolution ADC. The pipelined successive comparative ADC includes a first successive comparative ADC for implementing a rough A/D conversion, a second successive comparative ADC for implementing a fine A/D conversion and an intermediate residue calculating circuit comprised of an amplifier and a capacitive DAC. In this way, the pipelined successive comparative ADC requires two successive comparative ADCs serially connected with one another and the capacitive DAC to perform D/A conversion of the converted value by the first successive comparative ADC in addition to the inherent capacitive DACs contained in the two successive comparative ADCs. Therefore, the number of capacitor of the entire circuit containing the pipelined successive comparative ADC is relatively increased so that the circuit area is also increased (see U.S. Pat. No. 6,124,818). In this way, there is such a problem that the circuit areas of the conventional successive comparative ADCs and the conventional pipelined successive comparative ADCs are enlarged due to the increase of the number of capacitors.

BRIEF SUMMARY OF THE INVENTION

It is an object of the present invention, in view of the above conventional problem, to provide an A/D converter which can realize fast conversion as a pipelined successive comparative ADC and the area of the entire circuit containing A/D converters can be reduced.

In order to achieve the object of the present invention, an aspect of the present invention relates to an A/D converting apparatus including: a first A/D converter to sample an analog input signal having a D/A converter to generate a comparative signal for successive comparison with the analog input signal, a signal generator to generate a differential signal between the analog input signal and the comparative signal, and a comparator to compare the comparative signal with a standard value to generate a first digital signal exhibiting high-order bit; an amplifier to amplify the differential signal to generate a residue signal; and a second A/D converter to sample the residue signal to generate a second digital signal exhibiting low-order bit.

Another aspect of the present invention relates to an A/D converting apparatus including: a D/A converter to generate a comparative signal for successive comparison with an input signal; a signal generator to generate a differential signal between the input signal and the comparative signal; a comparator to compare the comparative signal with a standard value to generate a digital signal; an amplifier to amplify the differential signal to generate a residue signal; and a switch to send either an analog input signal or the residue signal to the D/A converter.

Still another aspect of the present invention relates to an A/D converting apparatus including: a first A/D converter to sample an analog input signal at a first timing to generate a first analog signal, the first A/D converter having a first D/A converter to generate a first comparative signal for successive comparison with the first analog signal, a first signal generator to generate a first differential signal between the first analog signal and the first comparative signal, and a first comparator to compare the first comparative signal with a first standard value to generate a first digital signal exhibiting a first high-order bit; a second A/D converter to sample the analog input signal at a second timing different from the first timing to generate a second analog signal, the second A/D converter having a second D/A converter to generate a second comparative signal for successive comparison with the second analog signal, a second signal generator to generate a second differential signal between the second analog signal and the second comparative signal, and a second comparator to compare the second comparative signal with a second standard value to generate a second digital signal exhibiting a second high-order bit; a third D/A converter to hold the first differential signal and the second differential signal to implement analog conversion; an amplifier to amplify the first differential signal and the second differential signal which are analog-converted to generate a first residue signal and a second residue signal; a third A/D converter to sample the first residue signal to generate a third digital signal exhibiting a first low-order bit corresponding to the first high-order bit; and a fourth A/D converter to sample the second residue signal to generate a fourth digital signal exhibiting a second low-order bit corresponding to the second high-order bit.

DETAILED DESCRIPTION OF THE INVENTION

A pipelined successive comparative ADC allows rough A/D conversion and fine A/D conversion at a common timing. Namely, since the input sampling at the rough A/D conversion and the input sampling at the fine A/D conversion for processing the result of the rough A/D conversion (residue signal) are implemented simultaneously (at a common timing), one capacitive DAC is required for generating (holding) the residue signal. The capacitive DAC implements the D/A conversion using the capacitance of the capacitor thereof, resulting in the enlargement of the area of the entire circuit structure. By controlling the operation timing of two ADCs of the pipelined successive comparative ADC, in this embodiment, a plurality of functions are imparted to the first ADC so as to realize the fast conversion of the pipelined successive comparative ADC and reduce the area of the entire circuit.

Hereinafter, embodiments will be described with reference to drawings.

Figure 1:
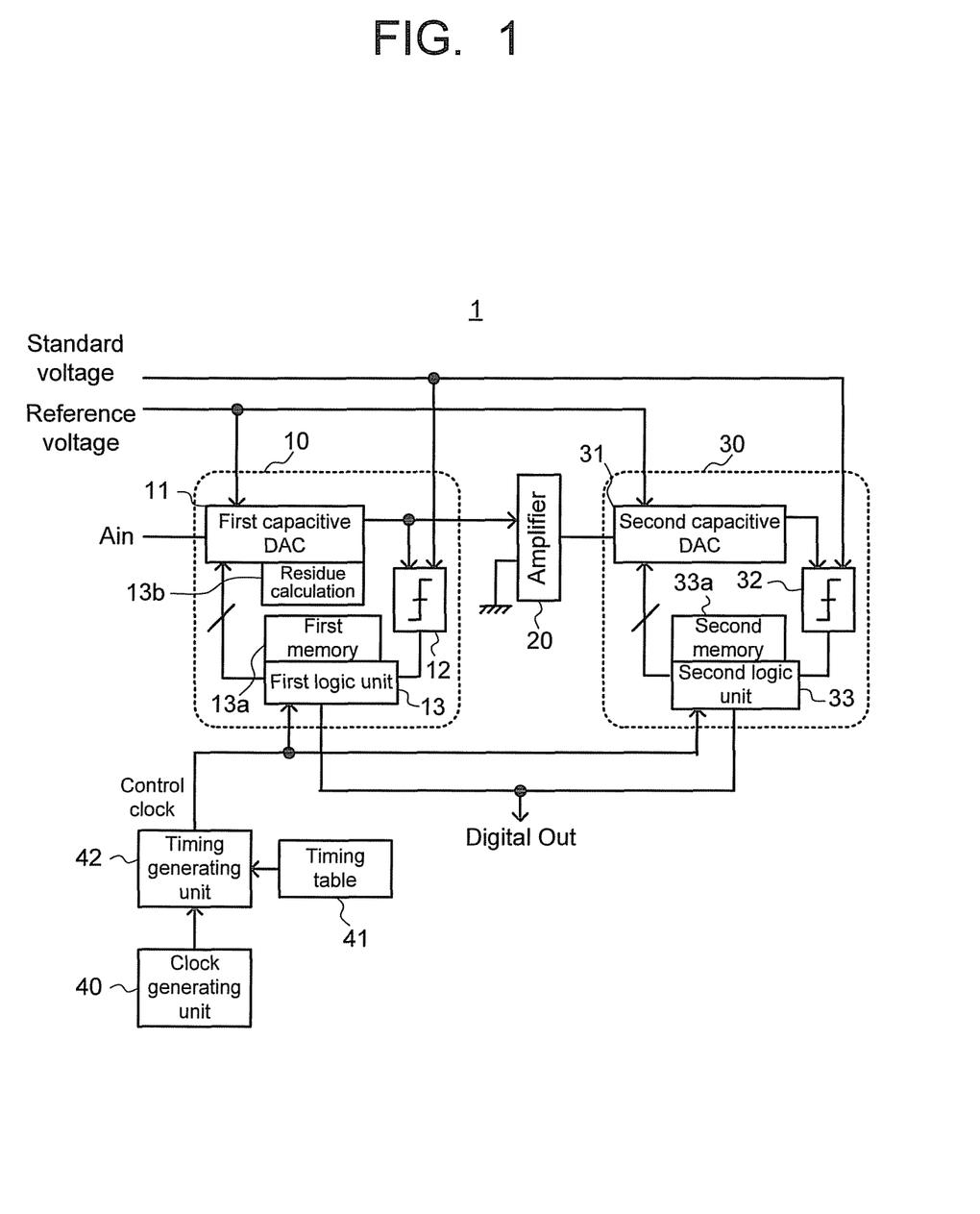
FIG. 1 is a block diagram related to the structure of the A/D converter according to a first embodiment.

As shown in FIG. 1, in this embodiment, the A/D converter 1 (hereinafter, often called as an "ADC 1") includes a first ADC unit 10, an amplifier 20, a second ADC unit 30, a clock generating unit 40, a timing table 41 and a timing generating unit 42.

The first ADC unit 10 implements rough A/D conversion for an input analog signal Ain to generate a digital signal corresponding to high-order bits. The first ADC unit 10 includes a first capacitive digital-to-analog converting unit (DAC) 11, a first comparator 12 and a first logic unit 13. The first capacitive DAC 11 is configured so as to hold the analog signal Ain based on a control signal supplied from the first logic circuit 13 and a predetermined reference voltage and to generate an analog voltage based on the voltage of the analog signal Ain through binary search. The first comparator 12 refers to an analog voltage generated by the DAC 11 and a predetermined standard voltage so as to generate an analog-to-digital conversion value of "1" when the analog voltage is larger than the standard voltage and to generate another analog-to-digital conversion value of "0" when the analog voltage is smaller than the standard voltage. The first logic circuit 13 refers to the analog-to-digital conversion value generated at the first comparator 12 and a control clock and the like supplied from the timing generating unit 42 and generates a control signal for controlling the first capacitive DAC 11 so that the successive comparative voltage can be small when the analog-to-digital conversion value is "1". The first logic unit 13 is configured such that the analog-to-digital conversion value can be stored in a first memory 13$a$. A residue calculation controlling unit 13$b$ generates a residue signal based on the analog input signal Ain and the analog-to-digital conversion value. Namely, the first ADC unit 10 constitutes a SAR-A/D converter (Successive Approximation Routine Analog-to-Digital Converter) to output an analog-digital signal with one bit or more.

An amplifier 20 is configured as an analog signal amplifier which amplifies the residue component signal generated at the first ADC unit 10 and the residue calculation controlling unit 13$b$ at a predetermined amplification factor based on the ground potential as a standard voltage, thereby generating a residue signal.

The second ADC unit 30, which is equivalent to the first ADC unit 10, implements fine A/D conversion for the residue signal amplified by the amplifier 20 to generate a digital signal corresponding low-order bits. The second ADC unit 30 includes a second capacitive DAC 31, a second comparator 32 and a second controlling unit 33. The second capacitive DAC 31, the second comparator 32 and the second controlling unit 33 correspond to the first capacitive DAC 11, the first comparator 12 and the first controlling unit 13, respectively so that the second capacitive DAC 31, the second comparator 32 and the second controlling unit 33 are configured in function and structure as the first capacitive DAC 11, the first comparator 12 and the first controlling unit 13, respectively. The second ADC unit 30 is configured as the first ADC unit 10 and then, constitutes a second SAR-A/D converter to generate and output an analog-to-digital conversion value with one bit or more from the residue signal amplified by the amplifier 20 as an input signal. The first memory 13$a$ stores analog-to-digital conversion values with high-order bits, and the second memory 33$a$ stores analog-to-digital conversion values with low-order bits.

The clock generating unit 40 is an oscillator to generate a clock signal for defining the operation of the A/D converter 1 entirely. The timing table 41 is a table storing the timing information relating to the operation timing of the first ADC unit 10 and the second ADC unit 30. The timing generating unit 42 is configured so as to generate a control clock and the like to define the operation of the first ADC unit 10 and the second ADC unit 30 based on the clock signal supplied from the clock generating unit 40 and the timing information supplied from the timing table 41.

Then, the operation of the A/D converter 1 in this embodiment will be described hereinafter with reference to FIG. 2. The operation status of the circuit components of the A/D converter 1 in this embodiment can be divided into three phases. The first phase is a sampling phase $a_1$ of the first ADC unit 10 which is shown as a phase $a_1$ in FIG. 2. The second phase is an A/D conversion phase $b_1$ of the first ADC unit 10 which is shown as a phase $b_1$ in FIG. 2. The third phase is a residue amplifying phase $c_1$ of the amplifier 30 and an A/D conversion phase $c_1$ of the second ADC unit 30 which are shown as a phase $c_1$ in FIG. 2. In the A/D converter 1 in this embodiment, the timing generating unit 42 generates a control clock $\phi s$ as a trigger to sample the analog signal Ain and generate some control signals (not shown) as triggers to implement the operations in the phases $a_1$ to $c_1$.

Once the timing generating unit 42 generates the control clock $\phi s$, the first ADC unit 10 samples the analog input signal Ain (t), which is a continuous time signal, by the first capacitive DAC 11 (Phase $a_1$). This sampling process is controlled by the control clock φs so that when the control clock φs is "1", the first capacitive DAC 11 is set to sampling state. The first capacitive DAC 11 holds the voltage generated at the transition of switch-on from switch-off of the control clock φs until the next switch-on of the control clock φs. Namely, the voltage of the analog input signal is held for a prescribed period of time. The sampling operation is implemented periodically and the time interval of the holding operation may be set to "T", then the held voltage can be represented by Ain (−T), Ain (0), Ain (T), Ain (2T) . . . .

When the control clock φs generated at the timing generating unit 42 is set to off-state, the circuit state is shifted to the A/D conversion phase (Phase $b_1$). In Phase $b_1$, the first ADC unit 10 implements successive A/D conversion using the first capacitive DAC 11, the first comparator 12 and the first logic unit 13. The first logic unit 13 stores the result of the A/D conversion at the first memory 13a. As described later, in Phase $b_1$, the second ADC unit 30 is implementing A/D conversion for the residue data.

Thereafter, the timing generating unit 42 transmits a control signal to be shifted to the residue amplifying phase to the first ADC unit 10 and the second ADC unit 30 (Phase $c_1$). In Phase $c_1$, the residue calculation controlling unit 13b calculates the residue signal based on the voltage of the analog input signal Ain held in the first capacitive DAC 11 and the analog-to-digital conversion value.

The calculation of the residue signal at the residue calculation controlling unit 13b can be realized in combination with the capacitor of the first capacitive DAC 11, for example. Supposed that the residue voltage can be represented by "Vresidue", the reference voltage can be represented by "Vref", the resolution of the first ADC unit 10 can be represented by "N bits" and the first capacitive DAC 11 holds the analog signal Ain (T), the residue signal can be represented by the equation (1). Herein, the symbol "D" corresponds to an analog-to-digital conversion value with N bits obtained at the first SAR-A/D converter.

$$V_{residue}=2^{(N-1)}*A_{in}(T)-D*V_{ref} \quad (1)$$

The amplifier 20 amplifies the residue signal calculated at the residue calculation controlling unit 13b to output the amplified residue signal. The second ADC unit 30 samples the amplified residue signal obtained at the amplifier 20. The amplifying and the sampling of the residue signal are implemented in Phase $c_1$ (until the timing generating unit 42 generates the control clock φs). Namely, the sampling at the first ADC unit 10 and the sampling at the second ADC unit 30 are implemented independently at a different timing. As shown in FIG. 2, when the sampling at the first ADC unit 10 is implemented in Phase $a_1$ and the A/D conversion at the first ADC unit 10 is implemented in Phase $b_1$, the second ADC unit 30 implements the A/D conversion for the residue signal. Hereinafter, the first ADC unit 10, the amplifier 20 and the second ADC unit 30 implement the operations relating to Phases $a_1$, $b_1$, $c_1$ repeatedly. The first ADC unit 10 implements analog-to-digital conversion relating to high-order bit and the second ADC unit 30 implements analog-to-digital conversion relating to low-order bit.

In this way, in the A/D converter 1 in this embodiment, the operation of the first capacitive DAC 11 is suspended during the sampling of the residue signal at the second capacitive DAC 31, which means that the first capacitive DAC 11 generates the residue signal for the second capacitive DAC 31 while the first capacitive DAC 11 samples the analog input signal Ain. Therefore, it is not required to additionally provide a new capacitive DAC for generating the residue signal.

As described above, in the A/D converter in this embodiment, the operation timing of the rough A/D converter and the fine A/D converter of the pipelined successive comparative A/D converter is modified so that the sampling and the generating of the residue signal at the fine A/D converter are implemented when the rough A/D converter is suspended. In this point of view, an additional capacitive DAC is not required between the rough A/D converter and the fine A/D converter which are connected in pipeline with one another. As a result, the number of capacitor of the capacitive DAC can be reduced so as to reduce the area for the entire circuit.

Then, the A/D conversion operation of the first ADC unit 10 or the second ADC unit 30 of the A/D converter 1 in this embodiment will be described with reference to FIG. 3. Typically, the fundamental operation of the first ADC unit 10 will be described hereinafter.

Figure 3:
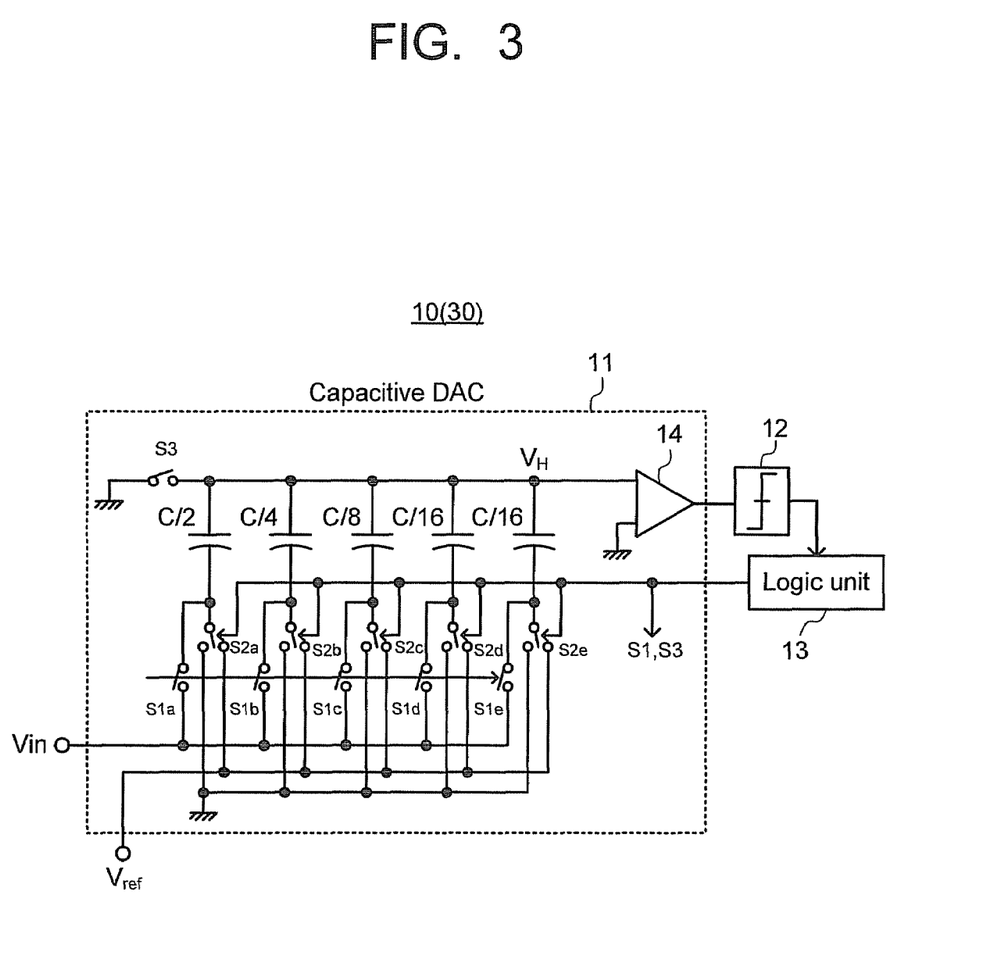
FIG. 3 is a block diagram related to the structure of the A/D converting unit of the A/D converter in the first embodiment.

As shown in FIG. 3, the first ADC unit 10 in this embodiment includes a plurality of capacitors C/2, . . . , C/16 which are binarily weighted in capacitance and of which the one ends (hereinafter, called as "top terminal"s) are grounded via a switch S3, monopole single throw switches S1a to S1e of which one ends are connected with the other ends (hereinfter, called as "bottom terminal"s) of the capacitors C/2, . . . , C/16 and monopole double throw switches S2a to S2e of which common terminals are connected with the bottom terminals of the capacitors, an amplifier 14 of which the input terminals are connected with the top terminals of the capacitors and the ground, a comparator 12 of which the input terminal is connected with the output terminal of the amplifier 14 to output numeral "1" or "0", and the first logic unit 13 to control the switches S2a to S2e by the output signal from the comparator 12 to be input therein.

The symbols "C/2", "C/4", "C/8", "C/16", "C/16" of the capacitors mean the ratios in capacitance of the capacitors so that the ratios in capacitance of the capacitors are set to 1/2, 1/4, 1/8, 1/16, 1/16, respectively, corresponding to the symbols "C/2", "C/4", "C/8", "C/16", "C/16". The other ends of the monopole single throw switches S1a to S1e are connected with the input terminal Vin. The one contacts of the monopole double throw switches S2a to S2e are grounded and the other contacts thereof are connected with the terminal kept at a reference voltage of Vref.

The first ADC unit 10 shown in FIG. 3 implements the A/D conversion through the sampling of input signal, the connecting of one ends of capacitors to a terminal kept at a standard voltage (in this case, the voltage $V_H$ is changed), the generating and holding of digital value at the amplifier and the comparator based of the voltage $V_H$ and the ground voltage, and the disconnecting of the terminal kept at the standard voltage from the capacitors. Concretely, the process of the connection of the capacitors to the terminal kept at the standard voltage through the generating and holding of the digital value is implemented with the capacitor C/2 with largest capacitance through the capacitor C/16 with smallest capacitance.

Figure 4A:
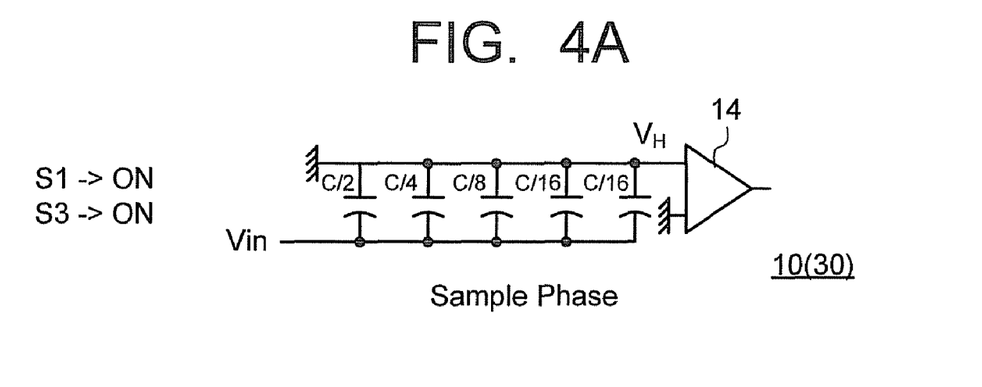
FIG. 4A is a view related to a signal sampling phase in the A/D converting unit of the first embodiment.
Figure 4B:
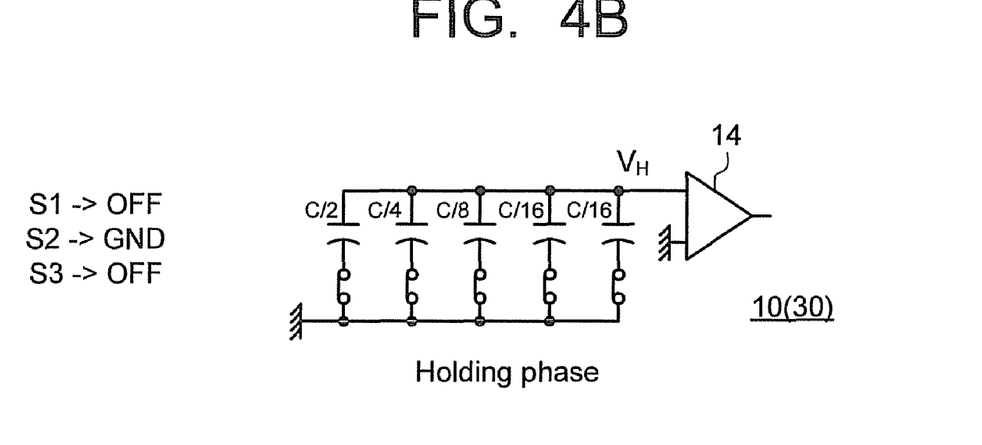
FIG. 4B is a view related to a holding phase in the A/D converting unit of the first embodiment.
Figure 4C:
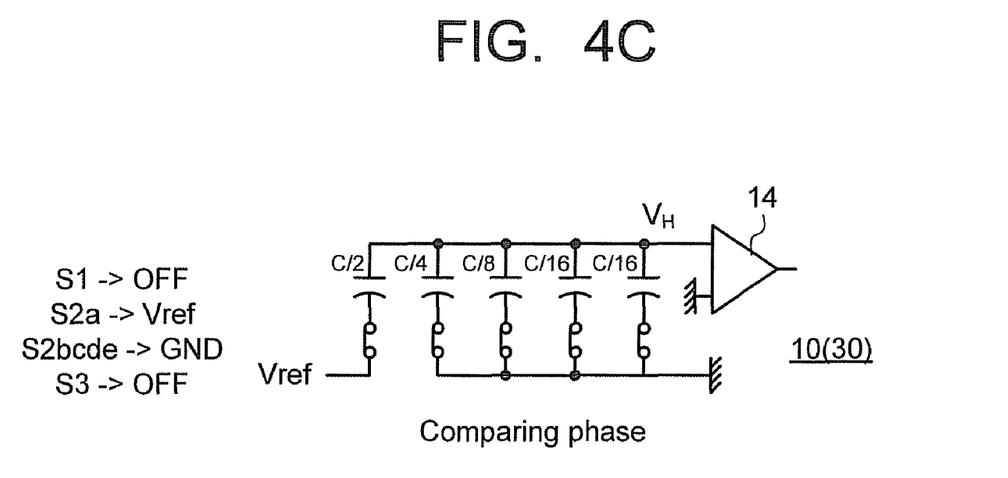
FIG. 4C is a view related to a comparing phase in the A/D converting unit of the first embodiment.

Then, the fundamental operation of the first ADC unit 10 in this embodiment will be described with reference to FIGS. 4A to 4C. The first ADC unit 10 implements (1) signal sampling phase, (2) holding phase and (3) comparing phase, repeatedly.

The monopole single throw switches S1a to S1e and the switch S3, which are controlled by the control signal generated at the first logic unit 13, implement the signal sampling phase. In the signal sampling phase, the first logic unit 13 generates a control signal for switching the monopole single throw switches S1a to S1e and the switch S3 on. As a result, the monopole single throw switches S1a to S1e and the switch S3 are switched on. In this case, the top terminals (in the side symbolized by $V_H$) of all of the capacitors are grounded and the bottom terminals (in the side symbolized by the switches S1a to S1e) are connected with the input signal terminal Vin. The connection state of the capacitors are shown in FIG. 4A. The electric charge Q to be stored at all of the capacitors can be represented by the equation (2) under the condition that the total capacitance of the capacitors is represented by a symbol "C".

$$Q = CV_{in} \quad (2)$$

Then, the holding phase is implemented after the signal sampling phase. The first logic unit 13 controls and turns the switches S1a to S1e and S3 off. In addition, the first logic unit 13 selects the monopole double throw switches S2a to S2e to the sides of the ground potential. Namely, all the top terminals of the capacitors are separated from the ground potential by turning the switch S3 off, and the bottom terminals of all the capacitors are separated from the input signal terminal Vin by turning the switches S1a to S1e off, and the bottom terminals of the capacitors are grounded by selecting the switches S2a to S2e. The connection state of the capacitors are shown in FIG. 4B. Therefore, the electric potential of the top terminals of the capacitors is shifted by −Vin.

Then, the comparing phase is implemented after the holding phase. In the comparing phase, the reference voltage is applied to the bottom terminal of one of the capacitors which has a largest capacitance. The connection state of the capacitors is shown in FIG. 4C. In this case, the first logic unit 13 applies the reference voltage Vref to the monopole double throw switch S2a while the switches S2b to S2e are controlled so that the bottom terminal of other capacitors are grounded. In this case, the voltage $V_H$ of the top terminals of the capacitors can be represented by the equation (3).

$$V_H = -V_{in} + \frac{1}{2} V_{ref} \quad (3)$$

Herein, the top terminals kept at the voltage $V_H$ are connected with the comparator 12 via the amplifier 14. The amplifier 14 amplifies and outputs a positive or negative signal obtained on the basis of the differential voltage between the voltage $V_H$ and the ground voltage. The comparator 12 outputs a signal corresponding to numeral "1" when the amplifier 14 outputs the positive signal. Namely, the voltage $V_H$ is compared with the ground voltage and thus, the obtained compared result is output from the comparator 12. The compared result becomes numeral "1" when the voltage $V_H$ is positive and becomes numeral "0" when the voltage $V_H$ is negative. The compared result is held as a highest-order bit related to the analog-to-digital conversion in the first memory 13a of the first logic unit 13.

The bottom terminal of the capacitor C/2 with maximum capacitance is connected with the terminal with the reference voltage Vref as it is when the analog-to-digital conversion result is numeral "1" on the basis of the analog-to-digital conversion. The bottom terminal of the capacitor C/2 is switched to the ground from the terminal with the reference voltage Vref by the switch S2a on the indication of the first logic unit 13 when the analog-to-digital conversion result is numeral "0" on the basis of the analog-to-digital conversion so that the electric potential of the bottom terminal is set to the ground potential. The first logic unit 13 implements the above-described phase operation for the capacitor C/2 with the maximum capacitance through the capacitor C/16 with minimum operation successively. Namely, the phase operation is implemented four times so as to obtain four bits. Supposed that the analog-to-digital conversion value is set to Di (i=0, 1, 2, 3), the voltage $V_H$ can be represented by the equation (4). In this way, the A/D conversion can be realized.

$$V_H = -V_{in} + \left( \frac{1}{2} D_3 V_{ref} + \frac{1}{4} D_2 V_{ref} + \frac{1}{8} D_1 V_{ref} + \frac{1}{16} D_0 V_{ref} \right) \quad (4)$$

Figure 5:
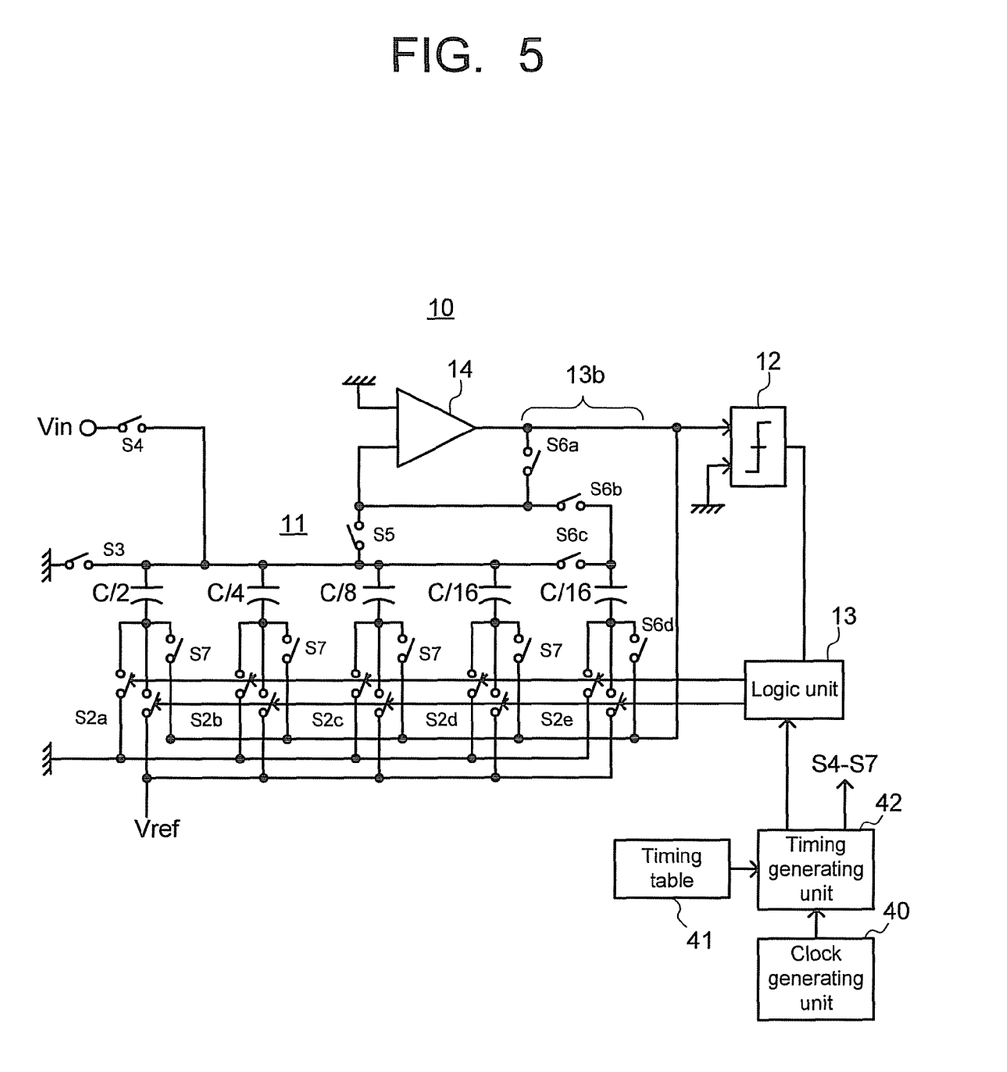
FIG. 5 is a circuit diagram relating to the concrete structure of a first ADC unit in the first embodiment.

The concrete structure of the first ADC unit 10 of the A/D converter 1 will be described with reference to FIGS. 5 and 6. As shown in FIG. 5, the first ADC unit 10 in this embodiment includes a switch S4 for switching the input of the signal Vin on or off, switches S6a to S6d for feeding back the output of the amplifier 14 into the input side of the capacitive DAC 11, a switch S5 for feeding back the output of the capacitive DAC 11 into the input side of the amplifier 14, and switches S7 for connecting the bottom terminals of the capacitors with the output side of the amplifier 14 in addition to the fundamental structure shown in FIG. 3. These switches are controlled on the basis of a control signal generated by the timing generating unit 42. The switches S6a to S6d function as the residue calculation controlling unit 13b.

Figure 2:
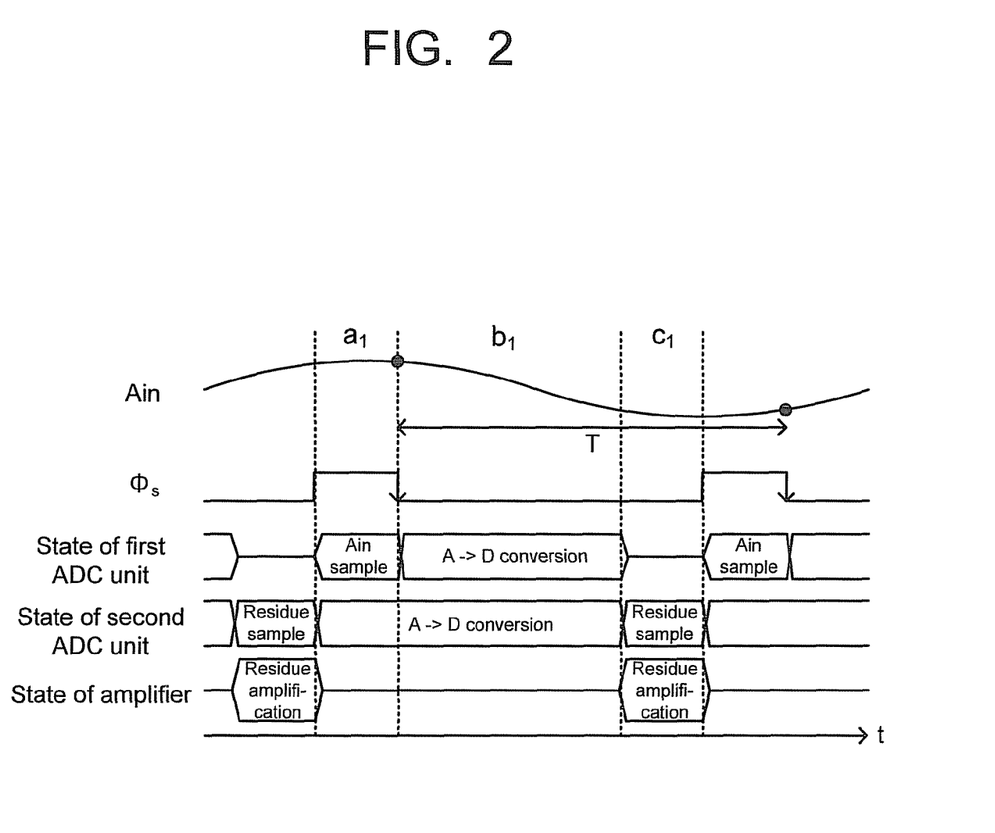
FIG. 2 is a timing chart showing the operation of the A/D converter in the first embodiment.

As shown in FIG. 2, the A/D converter in this embodiment includes the analog input signal sampling phase ($a_1$), the analog-to-digital converting phase ($b_1$), the residue signal amplifying phase ($c_1$) and the residue signal sampling phase ($c_1$). The first ADC unit 10 is related to the analog input signal sampling phase ($a_1$), the analog-to-digital converting phase ($b_1$) and the residue signal amplifying phase ($c_1$).

Figure 6A:
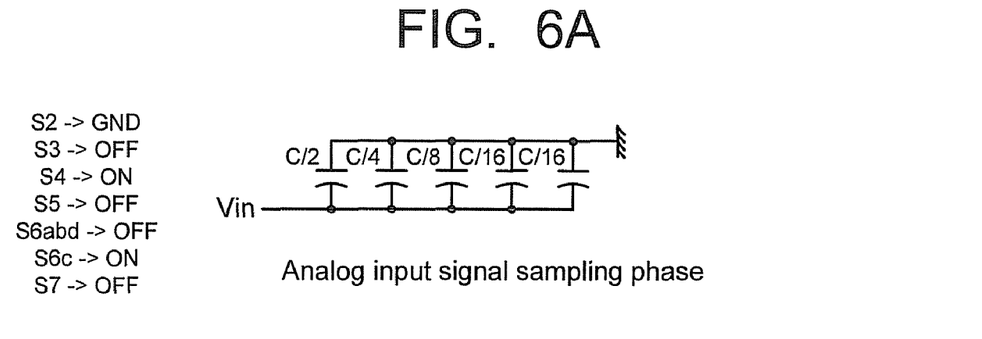
FIG. 6A is a view related to a sampling phase in the first ADC unit of the first embodiment.

As shown in FIG. 6A, the timing generating unit 42 controls the circuit of the first ADC unit 10 on the basis of the timing table 41 so that the switch S2 is switched to the ground, the switch S3 is switched off, the switch S4 is switched on, the switch S5 is switched off, the switches S6abd are switched off, the switch S6c is switched on and the switches S7 are switched off, thereby realizing the analog input signal sampling phase ($a_1$). In this state, the analog input signal Vin is applied to the one ends of the capacitors while the ground potential is applied to the other ends of the capacitors. The capacitors store electric charge to sample the analog input signal.

Figure 6B:
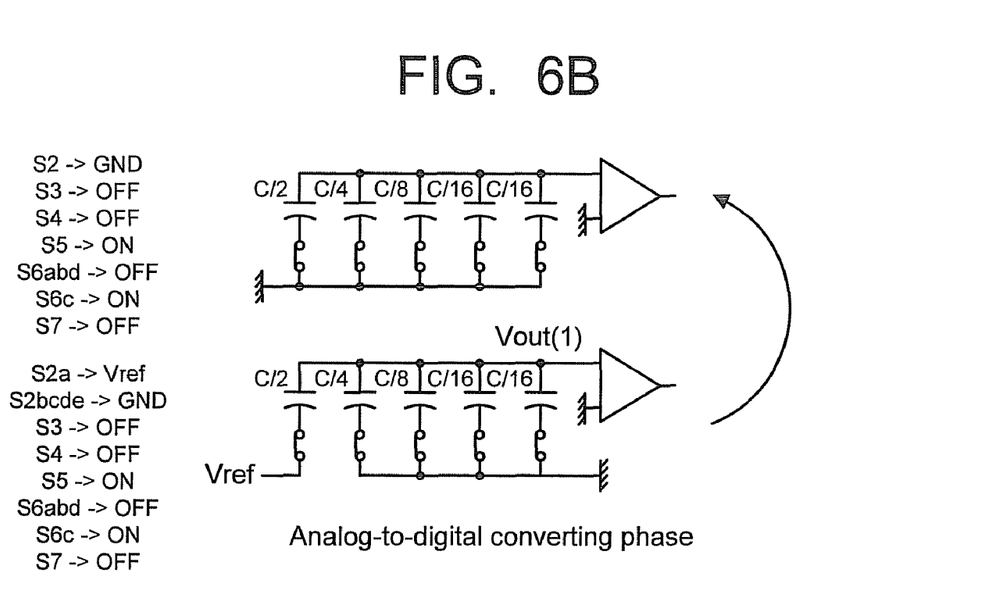
FIG. 6B is a view related to an A/D converting phase in the first ADC unit of the first embodiment.

Then, as shown in FIG. 6B, when the timing generating unit 42 controls the circuit of the first ADC unit 10 so that the switch S2 is switched to the ground, the switch S3 is switched off, the switch S4 is switched off, the switch S5 is switched on, the switches S6abd are switched off, the switch S6c is switched on and the switches S7 are switched off, the one ends of the capacitors are connected with the input terminal of the amplifier 14 while the other ends of the capacitors are connected with the ground. As a result, the electric potential at the input terminal of the amplifier 14 is shifted. Moreover, when the switch S2a is switched to the terminal with the reference voltage Vref from the terminal with ground potential on the basis of the control of the timing generating unit 42, the one end of the capacitor C/2 is switched to the terminal with the reference voltage Vref from the terminal with the ground potential. This operation corresponds to the analog-to-digital operation so as to realize the analog-to-digital conversion phase ($b_1$).

Figure 6C:
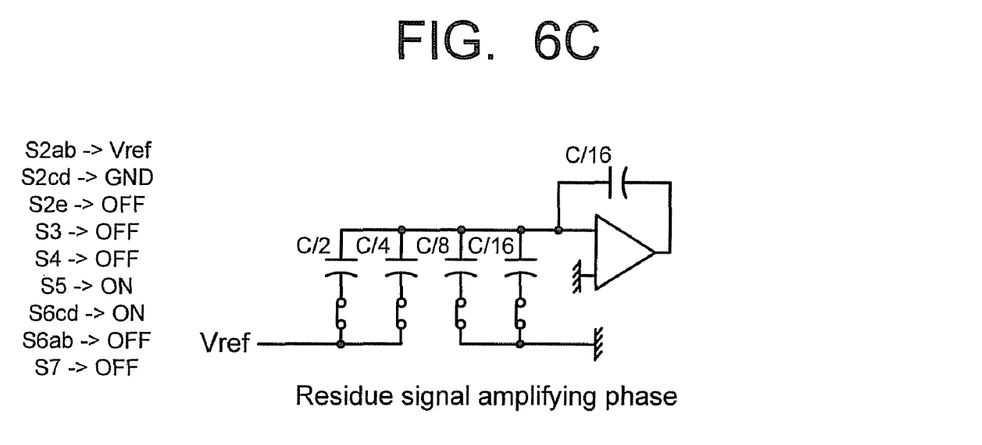
FIG. 6C is a view related to a residue signal amplifying phase in the first ADC unit of the first embodiment.

Then, as shown in FIG. 6C, when the timing generating unit 42 controls the circuit of the first ADC unit 10 so that the switches S2a and S2b are connected with the terminal with the reference voltage Vref, the switch S2e is switched off, the switches S6c and S6d are switched on, the switches S6a and S6b are switched off, and the switches S7 are switched off, the bottom terminals of the capacitors C/2 and C/4 are switched to the terminal with the reference voltage Vref and one of the capacitors C/16 with minimum capacitance is connected as the feed-back capacitor of the amplifier 14 between the input terminal and the output terminal of the amplifier 14. This state corresponds to the residue signal amplifying phase ($c_1$). Since one of the capacitors constitutes the feed-back capacitor, the corresponding residue component (the differential component on the basis of the difference between the analog voltage input at the phase $a_1$ and the analog voltage obtained by the analog-to-digital conversion at the phase $b_1$ held at the capacitors, or the conversion errors at the first ADC unit 10) appears in the output signal of the amplifier 14.

In this way, since the first ADC unit 10 is configured such that one of the capacitors contributing the sampling of the analog input signal is functioned as the feed-back capacitor of the amplifier 14, the intended residue component signal can be obtained not using an external calculating means and/or DAC.

Then, an A/D converter according to a second embodiment of the present invention will be described with reference to FIG. 7. In this embodiment, the A/D converter is configured such that the timing between the rough A/D conversion and the fine A/D conversion is shifted through the switching of the connection between the constituent components of the A/D converting unit. Like or corresponding components are designated by the same reference numerals throughout FIGS. 1 to 7, and omitted in explanation.

Figure 7:
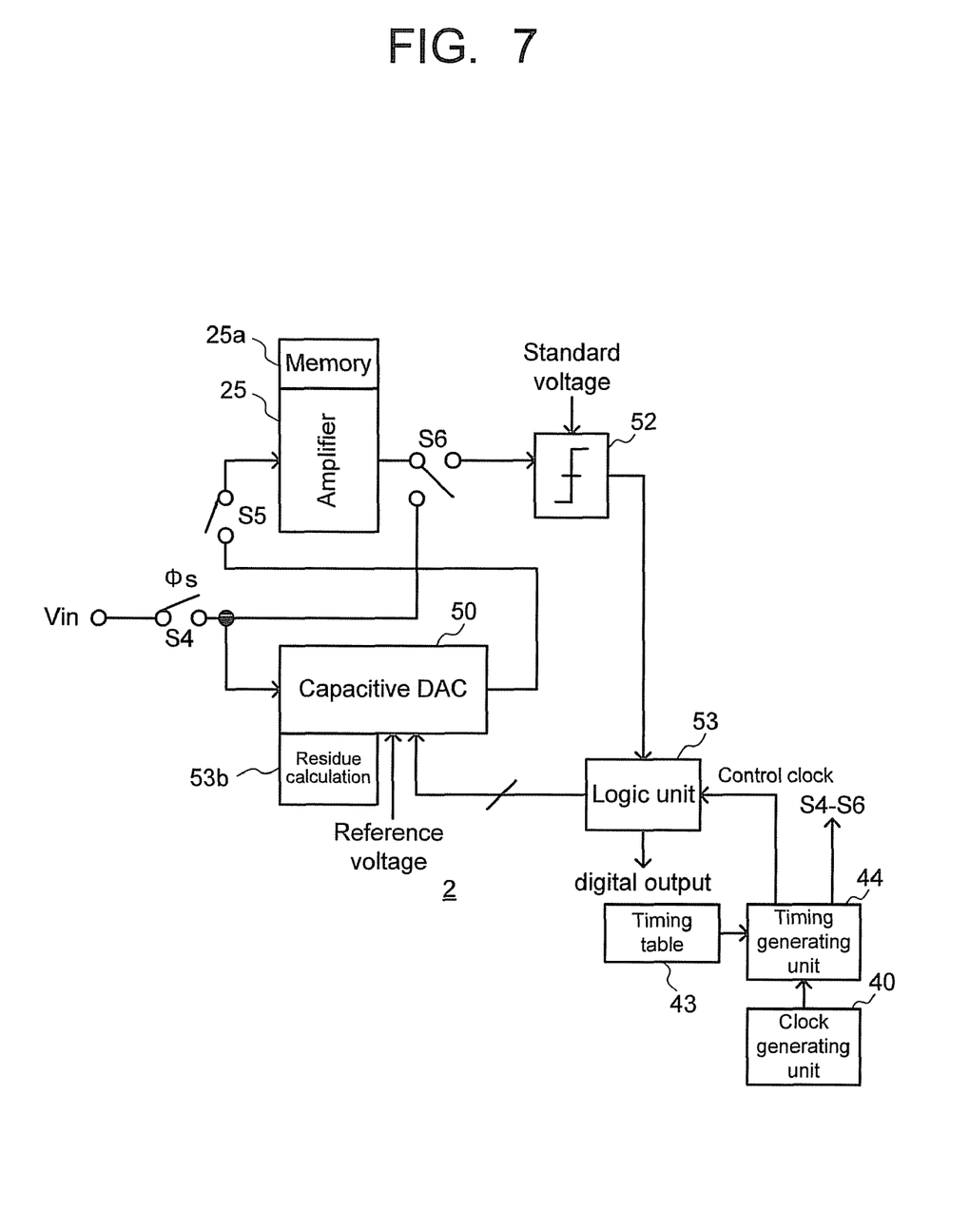
FIG. 7 is a block diagram related to the structure of the A/D converter according to a second embodiment.

As shown in FIG. 7, the A/D converter 2 in this embodiment includes a capacitive DAC 50, an amplifier 25, a memory 25a, a comparator 52, a logic unit 53, monopole single throw switches S4 and S5, a monopole double throw switch S6, a clock generating unit 40, a timing table 43 and a timing generating unit 44. The capacitive DAC 50, the amplifier 25, the comparator 52, the logic unit 53 and the clock generating unit 40 correspond to the first and second capacitive DAC 11 and 31, the amplifier 20, the first and second comparators 12 and 32, the first and second logic units 13 and 33 and the clock generating unit 40, respectively. Each component can exhibit the same function as the corresponding one.

The timing table 43 is a table storing the timing information relating to the operation timing of the capacitive DAC 50 and the switching information exhibiting the switching control of the switches S4 to S6. The timing generating unit 44 is configured so as to generate a control clock and the like to define the operation of the capacitive DAC 50 based on the clock signal supplied from the clock generating unit 40 and the timing information supplied from the timing table 43. In addition, the timing generating unit 44 functions as controlling the switching positions of the switches S4 to S6 based on the switching information.

The switch S4 functions as a sampler to input an analog input signal into the A/D converter 2 and output an internal signal of the A/D converter 2. The switch S5 functions as an amplifier input switch to send a residue component signal to the amplifier 25 as amplifier input signal. The switch s6 functions as an analog demultiplexer to input an amplified signal of the amplifier 25 into either one of the capacitive DAC 50 and the comparator 52.

Then, the operation of the A/D converter 2 in this embodiment will be described hereinafter with reference to FIG. 8. The A/D converter 2 in this embodiment includes five operation states of an analog input signal sampling phase ($a_2$), a high-order bit analog-to-digital converting phase ($b_2$), a residue signal amplifying phase ($c_2$), a residue signal sampling phase ($d_2$) and a low-order bit analog-to-digital conversion phase ($e_2$).

When the timing generating unit 44 generates the control clock φs so that the switch S4 is switched on and the switch S6 is connected with the comparator 52, the analog input signal sampling phase ($a_2$) can be realized. In the analog input signal sampling phase ($a_2$), the capacitive DAC 50 receives the input signal via the switch S4 to implement the sampling process.

Then, the timing generating unit 44 controls so that the switch S4 is switched off, the switch S5 is switched on and the switch S6 is connected with the comparator 52, thereby realizing the high-order bit analog-to-digital converging phase ($b_2$). The capacitive DAC 50 inputs an output voltage into the amplifier 25 via the switch S5. The amplifier 25 inputs the thus amplified output signal into the comparator 52 via the switch S6. The comparator 52 outputs a signal related to numeral "1" or "0" in accordance with the amplified output signal, and then, sends the signal related to numeral "1" or "0" to the logic unit 53. The logic unit 53 stores the signal related to numeral "1" or "0" in the memory unit thereof (not shown). This circuit operation is similar to the circuit operation of the first A/D conversion 10 in the first embodiment, thereby realizing the successive analog-to-digital conversion of the analog input signal.

Then, the timing generating unit 44 controls such that the switch S6 is switched to the capacitive DAC 50 and the switch S5 is switched on, thereby realizing the residue signal amplifying phase ($c_2$). The amplifier 25 amplifies the residue component signal supplied from the capacitive DAC 50 and stores the thus amplified residue component signal in the memory 25a. In this time, since the capacitive DAC 50 holds the residue component signal, the capacitive DAC 50 suspends the A/D conversion as shown in FIG. 8.

Then, the timing generating unit 44 controls such that the switch S6 is switched to the capacitive DAC 50 and the switch S5 is switched off, thereby realizing the residue signal sampling phase ($d_2$). The capacitive DAC 50 receives the amplifier output from the memory 25a to implement the sampling of the residue component signal.

Then, the timing generating unit 44 controls such that the switch S5 is switched on and the switch S6 is switched to the comparator 52, thereby realizing the low-order bit analog-to-digital conversion phase ($e_2$). The capacitive DAC 50 implements the A/D conversion for the residue component signal and then, supplies the converted residue component signal to the amplifier 25 via the switch S5. The amplifier 25 amplifies the converted residue component signal and then, inputs the thus amplified residue component signal into the comparator 52. The comparator 52 outputs a signal relating to numeral "1" or "0" and the logic unit 53 stores the signal output from the comparator 52.

Figure 8:
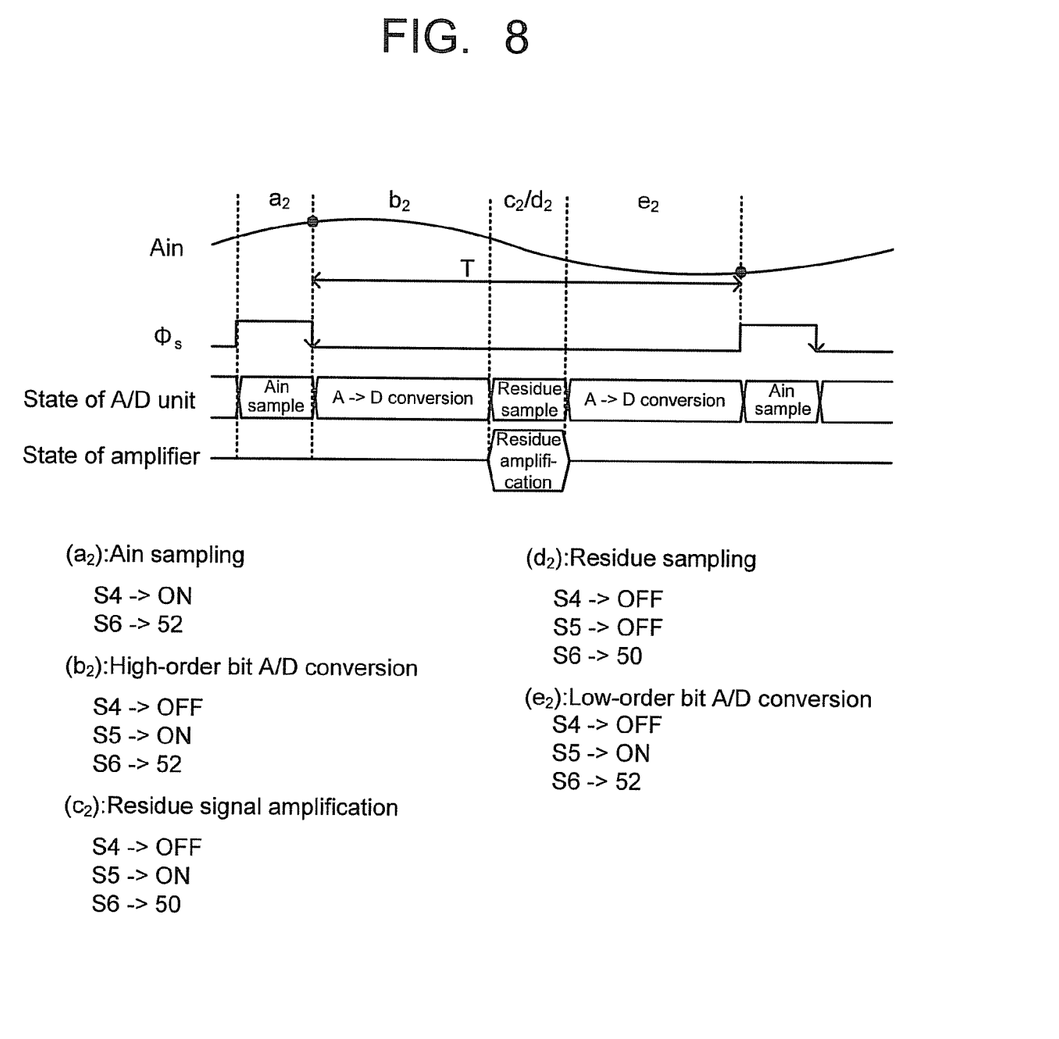
FIG. 8 is a timing chart showing the operation of the A/D converter in the second embodiment.

In the A/D converter 2 in this embodiment, as shown in FIG. 8, the A/D conversion for the input signal and the A/D conversion for the residue component signal are not implemented in pipeline form, but in serial form so that the timing of the sampling of the input signal Ain is shifted from the timing of the sampling of the residue component signal. As a result, a plurality of A/D converting units are not required so that the number of the capacitive DAC is reduced so as to decrease the area of the entire circuit of the A/D converter.

The concrete structure of the A/D converter according to the second embodiment will be described with reference to FIGS. 7 and 9A to 9D. Since the capacitive DAC 50 and the residue calculation controlling unit 53b in this embodiment correspond to the first capacitive DAC 11 and the residue calculation controlling unit 13b in the first embodiment, the explanation for the capacitive DAC 50 and the residue calculation controlling unit 53b will be omitted.

As described above, The A/D converter 2 in this embodiment includes five operation states of an analog input signal sampling phase ($a_2$), a high-order bit analog-to-digital converting phase ($b_2$), a residue signal amplifying phase ($c_2$), a residue signal sampling phase ($d_2$) and a low-order bit analog-to-digital conversion phase ($e_2$).

Figure 9A:
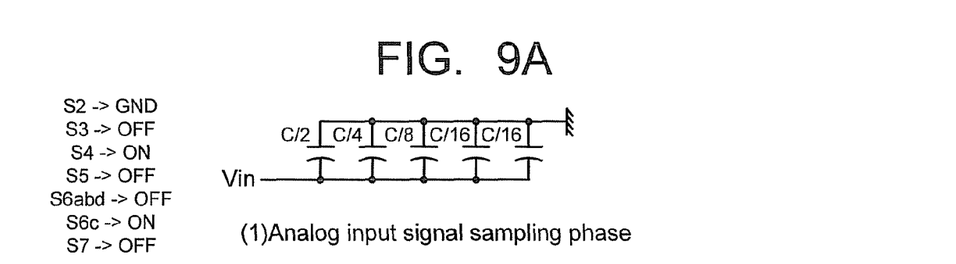
FIG. 9A is a view related to a signal sampling phase in the A/D converting unit of the second embodiment.

As shown in FIG. 9A, when the timing generating unit 44 controls on the basis of the timing table 43 so that the switch S2 is switched to the ground, the switch S3 is switched off, the switch S4 is switched on, the switch S5 is switched off and the switches S6abd are switched off, the switch S6c is switched on and the switches S7 are switched off, the analog input signal sampling phase ($a_2$) is realized. In this state, the analog input signal Vin is applied to the one ends of the capacitors while the ground potential is applied to the other ends of the capacitors. The capacitors store electric charge to sample the analog input signal.

Figure 9B:
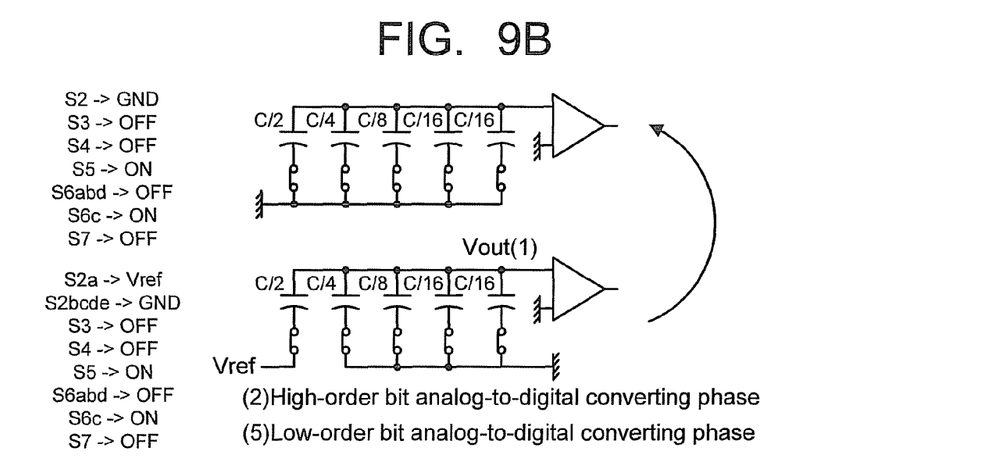
FIG. 9B is a view related to an A/D converting phase in the first ADC unit of the second embodiment.

Then, as shown in FIG. 9B, when the timing generating unit 42 controls so that the switch S2 is switched to the ground, the switch S3 is switched off, the switch S4 is switched off, the switch S5 is switched on, the switches S6abd are switched off, the switch S6c is switched on and the switches S7 are switched off, the one ends of the capacitors are connected with the input side of the amplifier 25 while the other ends of the capacitors are connected with the ground. As a result, the electric potential at the input terminal of the amplifier 25 is shifted. Moreover, when the switch S2a is switched to the terminal with the reference voltage Vref from the terminal with ground potential on the basis of the control of the timing generating unit 44, the one end of the capacitor C/2 is switched to the terminal with the reference voltage Vref from the terminal with the ground potential. This operation corresponds to the analog-to-digital operation as described above so as to realize the high-order bit analog-to-digital conversion phase ($b_2$). The low-order bit analog-to-digital conversion can be also realized in the same manner as the high-order bit analog-to-digital conversion phase ($b_2$).

Figure 9C:
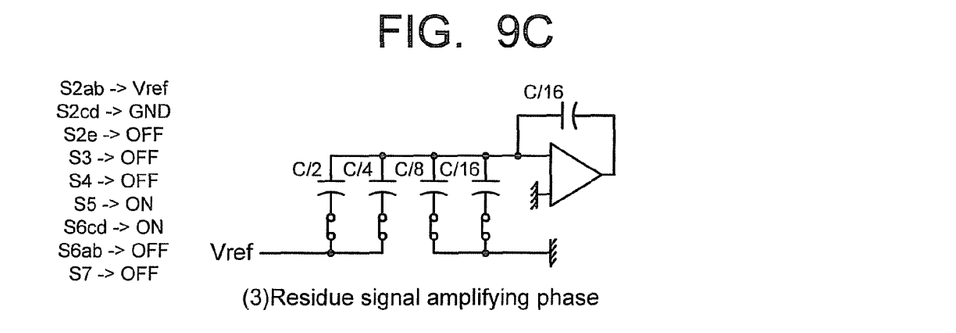
FIG. 9C is a view related to a residue signal amplifying phase in the first ADC unit of the second embodiment.
Figure 9D:
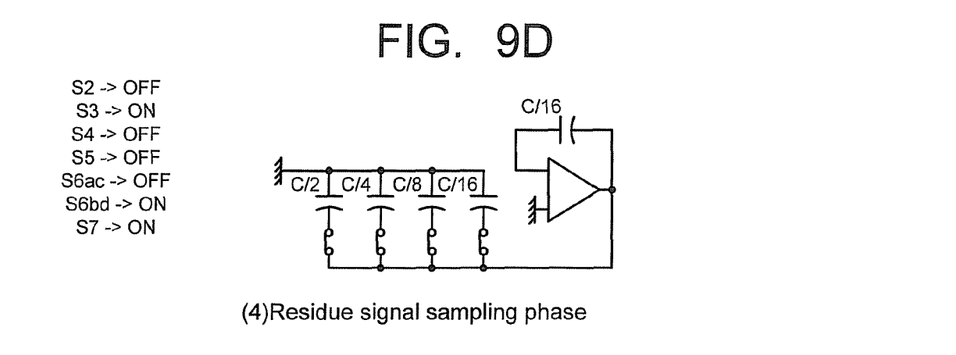
FIG. 9D is a view related to a residue signal sampling phase in the first ADC unit of the second embodiment.

Then, as shown in FIG. 9C, when the timing generating unit 44 controls so that the switches S2a and S2b are connected with the terminal with the reference voltage Vref, the switch S2e is switched off, the switches S6c and S6d are switched on, the switches S6a and S6b are switched off and the switches S7 are switched off, the bottom terminals of the capacitors C/2 and C/4 are switched to the terminal with the reference voltage Vref and one of the capacitors C/16 with minimum capacitance is connected as the feed-back capacitor of the amplifier 25 between the input terminal and the output terminal of the amplifier 25. This state corresponds to the residue signal amplifying phase ($c_2$). Moreover, when the switches S2 is switched off, the switch S3 is switched on, the switch S4 is switched off, the switch S5 is switched off, the switches S6a and S6c are switched off, the switches S6b and S6d are switched on and the switches S7 are switched on, the residue signal sampling phase ($d_2$) can be realized. In the embodiment relating to FIG. 9C, since the capacitance C/16 with minimum capacitance is employed as the feed-back capacitor of the amplifier 25, the output voltage Vout of the amplifier 25 can be gained 16 times as large as the inherent output voltage. The output voltage Vout is stored in the feed-back capacitor. In the embodiment relating to FIG. 9D, the output voltage of the amplifier 25 is gained 16 times as large as the inherent output voltage. In order to sample the output voltage Vout, the one ends of the capacitors except the feed-back capacitor C/16 are connected with the ground.

In this embodiment, one of the capacitors of the capacitive DAC is employed as the feed-back capacitor of the amplifier 25 so that no capacitor for the amplifier is additionally required and thus, the area of the entire circuit can be much reduced.

Then, an A/D converter according to a third embodiment of the present invention will be described with reference to FIGS. 10 and 11. In this embodiment, the A/D converter 3 is configured such that two successive comparative A/D converters are connected in parallel with one another so as to develop the sampling speed and capacitive DACs are sharable so as to reduce the area of the entire circuit.

Figure 10:
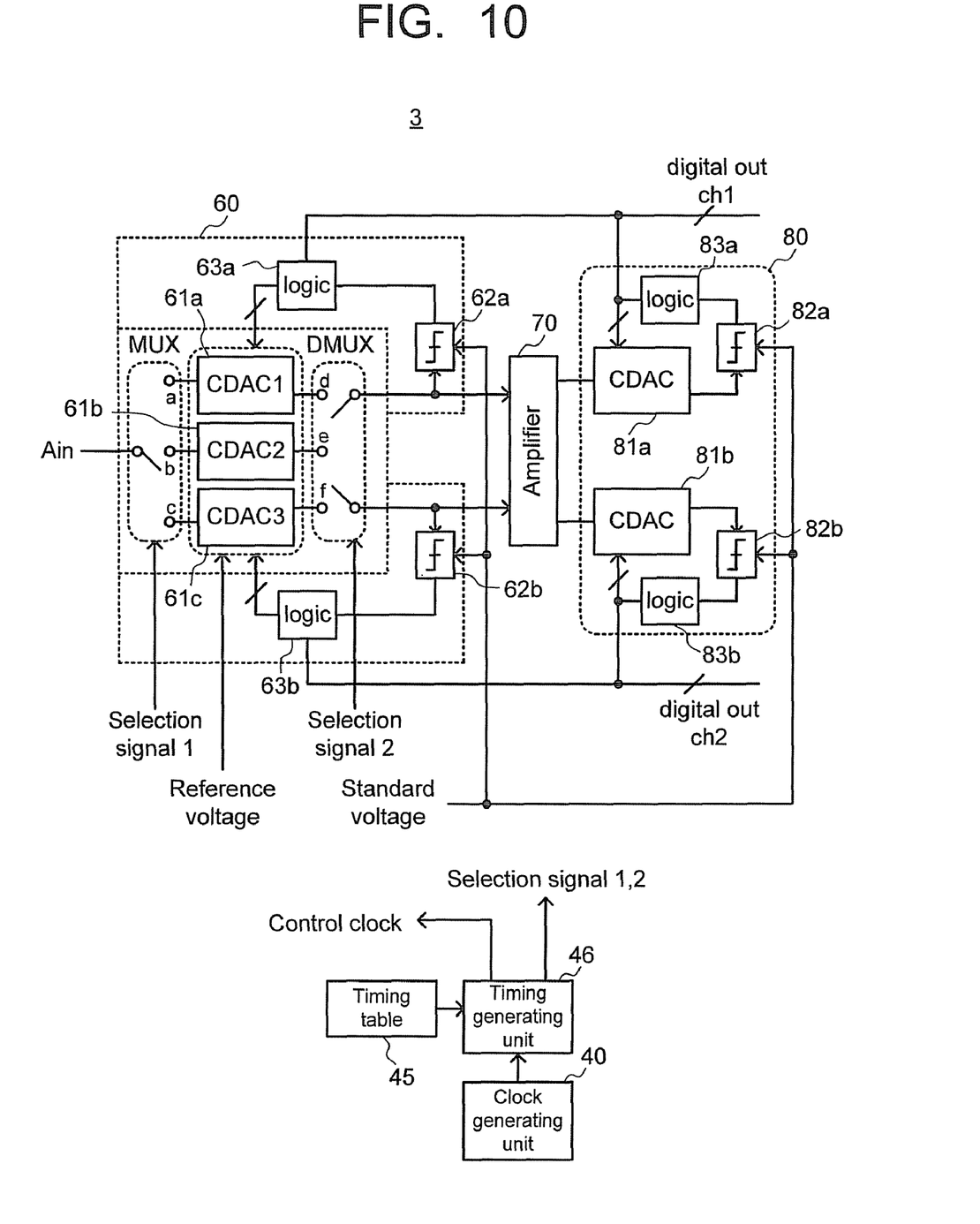
FIG. 10 is a block diagram related to the structure of the A/D converter according to a third embodiment.

As shown in FIG. 10, the A/D converter 3 in this embodiment includes an analog multiplexer MUX configured so as to switch the input terminal for the analog input signal Ain to either one of three output terminals, three capacitive DACs 61a to 61c of which the input terminals are connected with the respective output terminals of the analog multiplexer MUX, a demultiplexer DMUX configured so as to output two signals selected from three signals output from the corresponding capacitive DACs, two comparators 62a and 62b of which the input terminals are connected with the respective output terminals (two output terminals) of the demultiplexer DMUX and an A/D converting unit 60 with two logic units 63a and 63b. The output terminals of the comparators 62a and 62b are connected with the logic unit 63a and 63b, respectively. In view of analog-to-digital conversion values generated at the comparators 62a, 62b and a control clock supplied from a timing generating unit 46, the logic units 63a and 63b generate control signals to control the capacitive DACs 61a to 61c so that the corresponding comparative voltages can be reduced when the analog-to-digital conversion values are positive.

The A/D converter 3 includes an amplifier 70 for amplifying two output signals supplied from the demultiplexer DMUX.

The A/D converter 3 also includes two capacitive DACs 81a and 81b into which the corresponding amplifier outputs are input, a pair of comparators 82a and 82b into which output signals from the corresponding capacitive DACs 81a and 81b and a standard voltage are input to output a signal relating to numeral "1" or "0", and an A/D converting unit 80 with two logic units 83a and 83b. The output terminals of the comparators 82a and 82b are connected with the logic unit 83a and 83b, respectively. In view of analog-to-digital conversion values generated at the comparators 82a, 82b and a control clock supplied from a timing generating unit 46, the logic units 83a and 83b generate control signals to control the capacitive DACs 81a and 81b so that the corresponding comparative voltages can be reduced when the analog-to-digital conversion values become numeral "1", respectively.

Namely, the A/D converter 3 is configured such that two successive comparative A/D converting units are connected in parallel with one another and the capacitive DACs for amplification and calculation are sharable. Like or corresponding components exhibit common functions fundamentally in the first embodiment through the third embodiment.

Then, the operation of the A/D converter 3 in this embodiment will be described hereinafter with reference to FIG. 11. The A/D converter 3 is configured such that two successive comparative A/D converting units (CH1 and CH2) are connected in parallel with one another so as to implement time interleaved operation for the A/D converting units and thus, develop the sampling speed. In this embodiment, the capacitive DAC for holding a residue component signal is shared with the A/D converting units.

Figure 11:
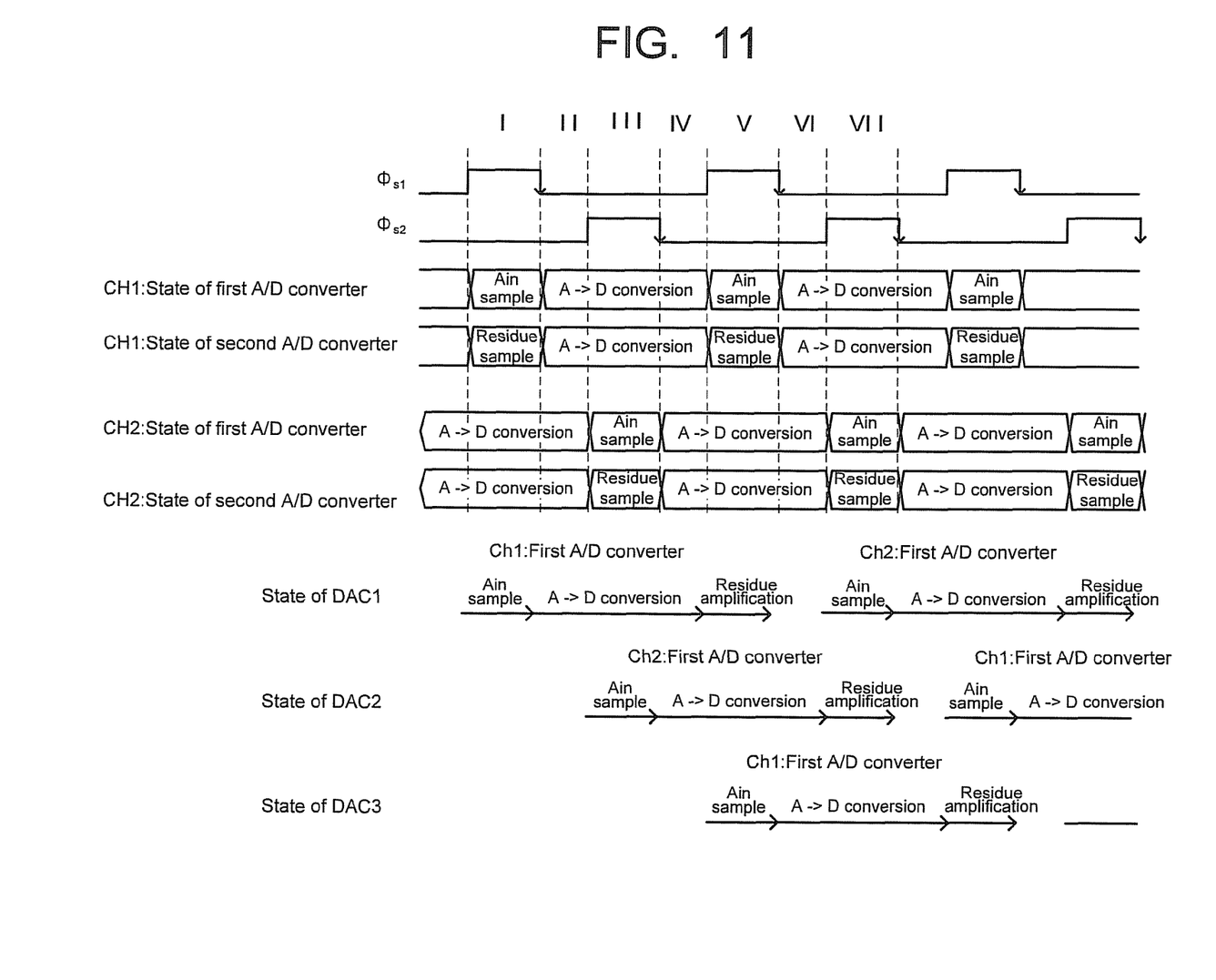
FIG. 11 is a timing chart showing the operation of the A/D converter in the third embodiment.

FIG. 11 shows the circuit states of the SAR-A/D converting unit in channel 1 (constituted from the capacitive DACs 61a to 61c and the capacitive DAC 81a) and the SAR-A/D converting unit in channel 2 (constituted from the capacitive DACs 61a to 61c and the capacitive DAC 81b) and the usage states of the capacitive DACs 61a to 61c to be employed for the A/D converting unit for high-order bit calculation. In FIG. 11, the symbol φs2 designates a control clock shifted in phase from the control clock φs1 by half clock. In sampling, the control clock φs1 is employed for the channel 1 and the control clock φs2 is employed for the channel 2.

First of all, when the timing generating unit 46 generates the control clock φs1 so that the multiplexer MUX switches the input terminal to the terminal "a" and the demultiplexer DMUX switches the top terminal thereof to the terminal "e", the capacitive DAC (hereinafter, called as a "CDAC") 61a is set to the state where an analog-to-digital signal is sampled and the CDAC 61b is set to the state where a residue signal is generated, held and sent to the CDAC 81b via the amplifier 70 (refer to Region "I" in FIG. 11). When the timing generating unit 46 controls such that the control clock φs1 is turned off, the multiplexer MUX is turned off (neutrality) and the demultiplexer is turned of f (refer to Region "II" in FIG. 11), the CDACs 61a and 81a are set to the state of A/D conversion for the analog input signal Ain and the residue component signal.

Then, when the timing generating unit 46 generates the control clock φs2 (on state) so that the multiplexer MUX switches the input terminal to the terminal "b" and the demultiplexer DMUX switches the bottom terminal thereof to the terminal "f", the CDAC 61b is set to the state where an analog-to-digital signal is sampled and the CDAC 61c is set to the state where a residue signal is generated, held and sent to the CDAC 81b via the amplifier 70 (refer to Region "III" in FIG. 11). In this time, the top terminal of the demultiplexer is switched to the terminal "d" so that the CDAC 61a is employed for A/D conversion in CH1. When the timing generating unit 46 does not generate the control clock φs2 (off state) so that the multiplexer MUX is turned off (neutrality) and the demultiplexer DMUX is turned off (refer to Region "IV" in FIG. 11), the CDACs 61b and 81b are set to the states where the analog input signal Ain and the residue component signal are analog-to-digital converted. Hereinafter, the operations relating to Regions "V", "VI", "VII" are implemented in the same manner.

In this way, in the A/D converter 3 in this embodiment, three capacitive DACs are employed and scheduled such that the using period of time of the capacitive DACs in the SAR-A/D converting unit (CDACs 61a and 81a) in CH1 is not superimposed with the using period of time of the capacitive DACs in the SAR-A/D converting unit (CDACs 61b and 81b) in CH2. Therefore, the conventional function using the four capacitive DACs and two capacitors can be realized only by using three capacitive DACs as described above. As a result, the number of capacitor can be reduced and the area of the entire circuit can be also reduced.

This invention is not limited to the above disclosure and embodiments and every kind of variation and modification may be made without departing from the scope of the present invention. For example, some characteristic components may be derived from one of the embodiments and combined with one another to realize various inventions. Moreover, some characteristic components may be removed from the above embodiments. In addition, some characteristic components may be derived from two or more of the embodiments and combined with one another.

What is claimed is:

1. An A/D converting apparatus, comprising:
a first A/D converter to sample an analog input signal having
a D/A convertor to generate a comparative signal for successive comparison with the analog input signal,
a signal generator to generate a differential signal between the analog input signal and the comparative signal, and
a comparator to compare the comparative signal with a standard value to generate a first digital signal exhibiting high-order bit;
an amplifier to amplify the differential signal to generate a residue signal; and
a second A/D converter to sample the residue signal to generate a second digital signal exhibiting low-order bit; and
a timing controller to suspend a sampling operation of the first A/D converter while the second A/D converter samples the residue signal.

2. The A/D converting apparatus of claim 1,
wherein the first A/D converter holds the analog input signal sampled for a predetermined period of time.

3. The A/D converting apparatus of claim 1,
wherein the D/A converter has a plurality of capacitors connected in parallel to one another.

4. The A/D converting apparatus of claim 3,
wherein ratios in capacitance of the plurality of capacitors are set to 1/2, 1/4, 1/8, 1/16, and 1/16.

5. The A/D converting apparatus of claim 3, further comprising a plurality of switches to apply one of the analog input signal, a reference voltage, or a grounded voltage to one end of the respective plurality of capacitors.

6. An A/D converting apparatus, comprising:
a D/A converter to generate a comparative signal for successive comparison with an input signal;
a signal generator to generate a differential signal between the input signal and the comparative signal;
a comparator to compare the comparative signal with a standard value to generate a digital signal;
an amplifier to amplify the differential signal to generate a residue signal; and
one or more switches to send either an analog input signal or the residue signal to the D/A converter; and
a timing controller to control the D/A converter to generate a second comparative signal based on a residue signal obtained by amplifying a differential signal of a first comparative signal after the D/A converter generates the first comparative signal based on the analog input signal and the comparator generates a first digital signal based on the first comparative signal.

7. An A/D converting apparatus, comprising:
a first A/D converter to sample an analog input signal at a first timing to generate a first analog signal, the first A/D converter having a first D/A converter to generate a first comparative signal for successive comparison with the first analog signal, a first signal generator to generate a first differential signal between the first analog signal and the first comparative signal, and a first comparator to compare the first comparative signal with a first standard value to generate a first digital signal exhibiting a first high-order bit;
a second A/D converter to sample the analog input signal at a second timing different from the first timing to generate a second analog signal, the second A/D converter having a second D/A converter to generate a second comparative signal for successive comparison with the second analog signal, a second signal generator to generate a second differential signal between the second analog signal and the second comparative signal, and a second comparator to compare the second comparative signal with a second standard value to generate a second digital signal exhibiting a second high-order bit;

a third D/A converter to hold the first differential signal and the second differential signal to implement analog conversion;

an amplifier to amplify the first differential signal and the second differential signal which are analog-converted to generate a first residue signal and a second residue signal;

a third A/D converter to sample the first residue signal to generate a third digital signal exhibiting a first low-order bit corresponding to the first high-order bit; and a fourth A/D converter to sample the second residue signal to generate a fourth digital signal exhibiting a second low-order bit corresponding to the second high-order bit.

* * * * *